United States Patent [19]
Gaudet et al.

[11] Patent Number: 5,633,606
[45] Date of Patent: May 27, 1997

[54] SCAN FLIP-FLOP THAT HOLDS STATE DURING SHIFTING

[75] Inventors: Brian C. Gaudet; Rajendran Sharma, both of San Jose; Ronald Pasqualini, Los Altos, all of Calif.

[73] Assignee: National Semiconductor Corporation, Santa Clara, Calif.

[21] Appl. No.: 504,898

[22] Filed: Jul. 20, 1995

Related U.S. Application Data

[63] Continuation-in-part of Ser. No. 450,970, May 25, 1995, abandoned.

[51] Int. Cl.$^6$ ............................................. H03K 3/289
[52] U.S. Cl. ................... 327/202; 327/203; 327/208; 327/210; 327/211
[58] Field of Search ........................... 317/199–203, 317/208–214; 371/22.3

[56] References Cited

U.S. PATENT DOCUMENTS

| | | | |
|---|---|---|---|
| 4,495,629 | 1/1985 | Zasio et al. | 327/202 |
| 5,015,875 | 5/1991 | Giles et al. | 327/203 |
| 5,175,447 | 12/1992 | Kawasaki et al. | 327/211 |
| 5,444,404 | 8/1995 | Ebzery | 327/202 |
| 5,463,338 | 10/1995 | Yurash | 327/202 |

FOREIGN PATENT DOCUMENTS

| 575401 | 3/1993 | Japan | 327/203 |
|---|---|---|---|

*Primary Examiner*—Timothy P. Callahan
*Assistant Examiner*—T. Lam
*Attorney, Agent, or Firm*—Limbach & Limbach L.L.P.

[57] ABSTRACT

A scan flip-fop is designed to hold the state of the slave latch during scan shifting. This allows an ATPG tool to develop robust delay path tests using combinational scan flip-flop models. Combinational scan flip-flop models suffice because the launch can be done in the cycle before test enable goes active and capture can be performed during the cycle in which test enable is active. Thus, multiple clocks during the capture cycle are not necessary and, therefore, sequential delay path ATPG is not necessary. It is only necessary for the ATPG tool to store the last parallel vector in a buffer. The dynamic latch used for the scan slave latch is made small and slow, thereby increasing the delay along the data path during shifting, making the cell immune to hold time violation for any reasonable amount of clock skew.

6 Claims, 4 Drawing Sheets

SCAN FLIP-FLOP THAT HOLDS STATE DURING SHIFTING

RELATED APPLICATION

The present invention is a continuation-in-part of application Ser. No. 08/450,970, filed May 25, 1995, now abandoned, by Gaudet et al.

BACKGROUND OF INVENTION

1. Field of the Invention

The present invention relates to integrated circuit testing and, in particular, to a scan flip-flop that holds state during scan mode, thereby allowing robust delay path tests to be developed using combinational automatic test pattern generation (ATPG).

2. Discussion of the Related Art

One method of testing integrated circuit devices for silicon defects is to generate ATPG vectors using both the stuck at fault model and the delay path fault model. The ATPG algorithms generally assume the circuit design to be combinational in nature. To aid the ATPG tool in this effort, some or all of the flip-flops in the circuit design are converted to scan flip-flops. These scan flops are stitched into one or more shift registers known as scan chains. This makes every scan flip-flop output a primary input and every scan flip-flop input a primary output.

As shown in FIG. 1, a standard scan flip-flop is a normal flip-flop 10 with a multiplexer (mux) 12 at the input of a master latch 14. The mux 12 is under the control of a test enable signal (TEZ). When TEZ is high (inactive), the mux 12 selects the D (normal data) input. When TEZ is low (active), the mux 12 selects the SD (scan data) input. This connects all the scan flip-flops in the scan chain into a shift register, the SD input of each flip-flop in the chain being connected to receive the Q or QZ output of the slave latch 16 of the previous flip-flop in the chain.

The protocol for applying ATPG vectors using scan chains is as follows. The values that the ATPG algorithm needs to apply to the device under test are shifted into the scan chains. The last clock cycle of this shift mode operation is known as the launch clock. The value at the Q outputs of the flip-flops in the scan chain after the launch clock are the values to be applied by the ATPG algorithm to the inputs of the combinational logic under test. Thus, the Q outputs of all scan flops can be considered primary inputs to the logic block under test. When TEZ goes high, the mux 12 selects the normal data input D instead of SD. This allows the logic value at D to be captured. Since the outputs of the combinational logic block under test are connected to D, the D inputs of the scan flops are used as primary outputs for the logic block under test.

The delay path fault model is used to test for circuit defects that cause an increase in the delay of a datapath in the device under test. Non-robust delay path testing considers a path tested if all on-path nodes undergo a steady state transition. No constraints are placed on off-path inputs. A problem with this model is that a different path than the targeted path might be tested. If this path is shorter, then the test may allow a defect to escape undetected. A robust delay path test considers a path tested if all on-path nodes undergo a steady state transition and all off-path inputs are held steady. This insures that the targeted path is tested. 100% robust delay path coverage of a selected faultlist is possible only with a scan flip-flop that can hold the state of the slave latch during shift mode.

U.S. Pat. No. 5,015,875, issued May 14, 1991, to Giles et al., provides an example of a scan flip-flop for use in a test mode scan operation. The Giles et al. flip-flop has the capability of not toggling its parallel output during the scan operation. It uses a master latch, which is controlled by a scan multiplexer, to update a slave latch having two alternate slave latch portions. Switching logic determines which of the alternate slave latches is updated with the incoming data signal. The normal test enable signal controls the switching logic. Therefore, the design requires no additional control signals.

During scan mode operation, data is clocked through the Giles et al. flip-flop from a scan-data-in terminal and out the scan-data-out terminal of one of the alternate slave latch portions without affecting the system data output Q of the other alternate slave latch portion. The shift sequence is followed by a capture interval during which the Q output is automatically updated with the desired data to test the targeted path. Thus, the path under test is not affected by the loading of the ATPG vector.

SUMMARY OF THE INVENTION

The present invention solves the problem of applying robust delay path vectors to a design under test by providing a scan flip-flop that holds the state of the slave latch during shifting. The scan flip-flop is more robust to shift hazards because the dedicated scan latch is made as small and weak as possible. The above two objects are accomplished with minimal impact on the size and performance of the flip-flop.

Thus, a scan flip-flop in accordance with the present invention is designed to hold the state of the Q and QZ outputs during scan shifting. This allows an ATPG tool to develop robust delay path tests using combinational scan flip-flop models. The reason combinational scan flip-flop models suffice is that the launch can be done in the cycle before test enable is lowered and the capture during the cycle where test enable is lowered. This means that multiple clocks during the capture cycle are not necessary and, therefore, sequential delay path ATPG, is not necessary. It is only necessary for the ATPG tool to store the last parallel vector in a buffer. The ability of the scan flip-flop to hold the state of Q and QZ outputs during shift makes this possible. The dynamic latch used for the scan slave latch is made small and slow, thereby increasing the delay along the datapath during shifting, making the cell immune to hold time violations for any reasonable amount of clock skew. Setup time is not a concern, since the datapath between scan flip-flops during shift mode is only metal.

This flip-flop differs from the Giles et al. flop discussed above in that it adds only one dynamic latch to the basic muxscan flop of FIG. 1 while the Giles et al. flop uses two extra static latches. In addition, the $t_{pd}$ through the normal operation datapath is smaller with this flop, passing through only are additional transfer gate; in contrast, in the Giles et al. flop, the normal datapath includes an extra latch.

Other features and advantages of the present invention will become apparent and be appreciated by reference to the following detailed description which should be considered in conjunction with the accompanying drawings.

DETAILED DESCRIPTION OF INVENTION

Figure 1:
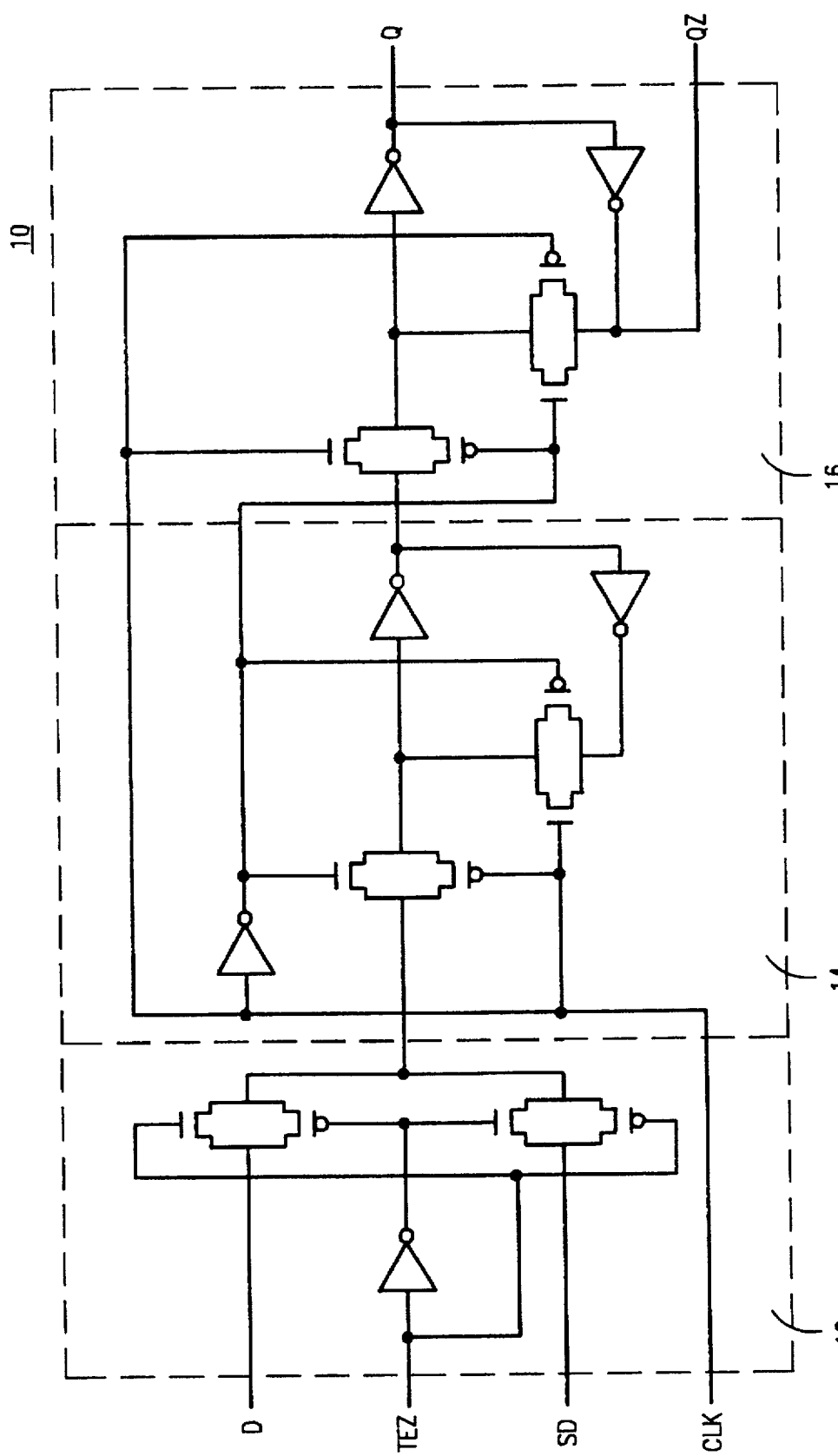
FIG. 1 is a schematic diagram illustrating a conventional scan flip-flop.
Figure 2:
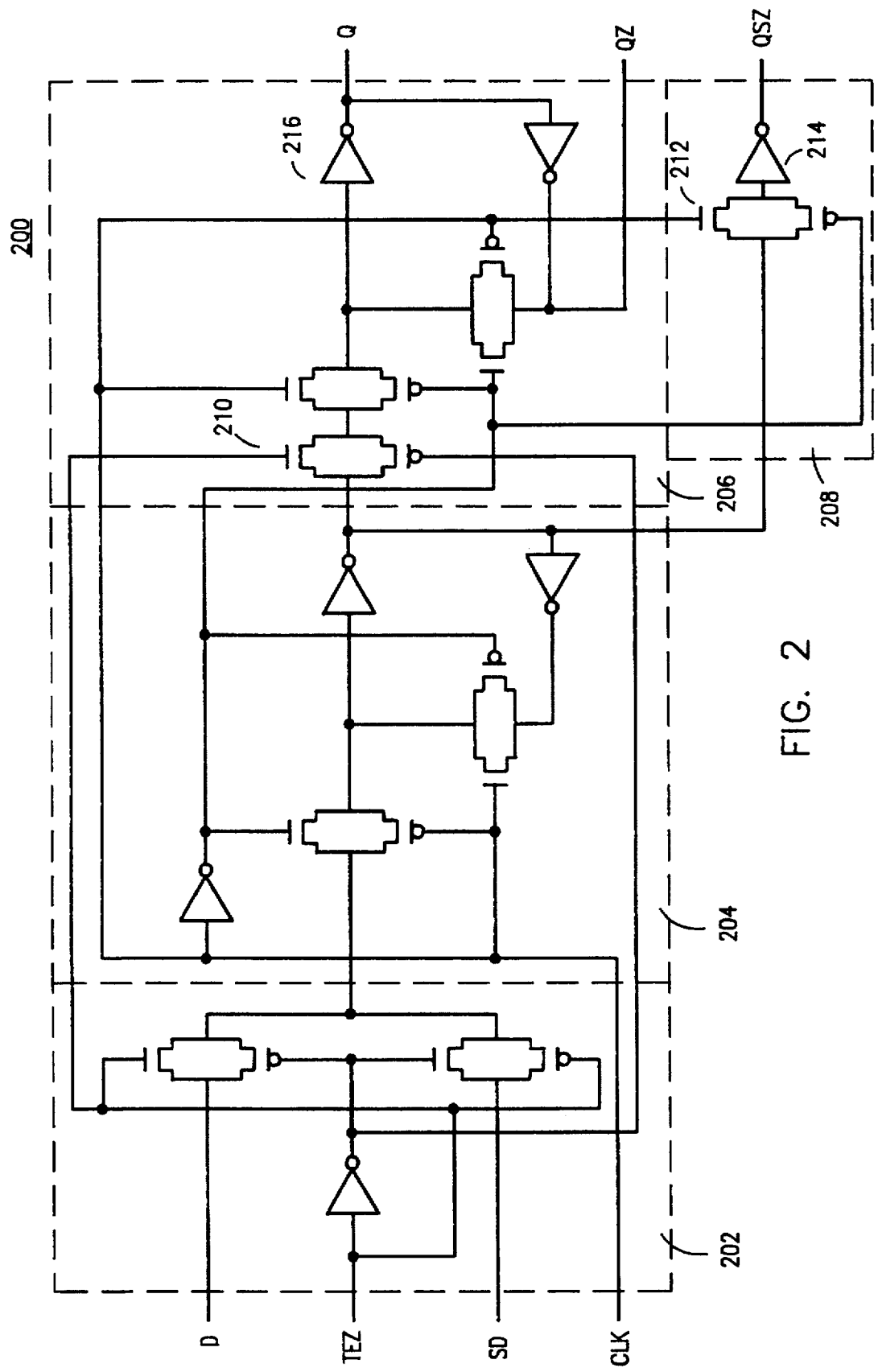
FIG. 2 is a schematic diagram illustrating a scan flip-flop in accordance with the present invention.

FIG. 2 shows a scan flip-flop 200 in accordance with the present invention. The scan flip-flop 200 includes a multiplexer 202, a master latch 204, a slave latch 206, all connected in a manner similar to the design of the FIG. 1 circuit 10. However, the FIG. 2 circuit 200 also includes a dynamic scan latch 208 and a pass gate 210, both connected to receive the output of master latch 204. The dynamic scan latch 208 includes pass gate 212 and inverter 214.

The select of the multiplexer 202 is the test enable input TEZ, which is active low. When high, because pass gate 210 is held "open", TEZ configures the device 200 as a normal positive edge triggered flip-flop consisting of master latch 204 and slave latch 206. When low, TEZ configures the device 200 as a dynamic positive edge triggered flip-flop consisting of master latch 204 and dynamic scan latch 208. In addition, when TEZ is low, the pass gate 210 is held "closed", thus holding the state of slave latch 206. The dynamic scan latch 208 is designed to hold state for 1 ms without a clock. It is also designed using minimum size transistors in inverter 214. This gives the maximum possible datapath delay between consecutive shift registers without increasing device size. This gives some degree of protection against shift hazards. Inverter 216 is used to decouple the feedback loop of the slave latch 206 from any capacitance seen at the QZ output.

Figure 3:
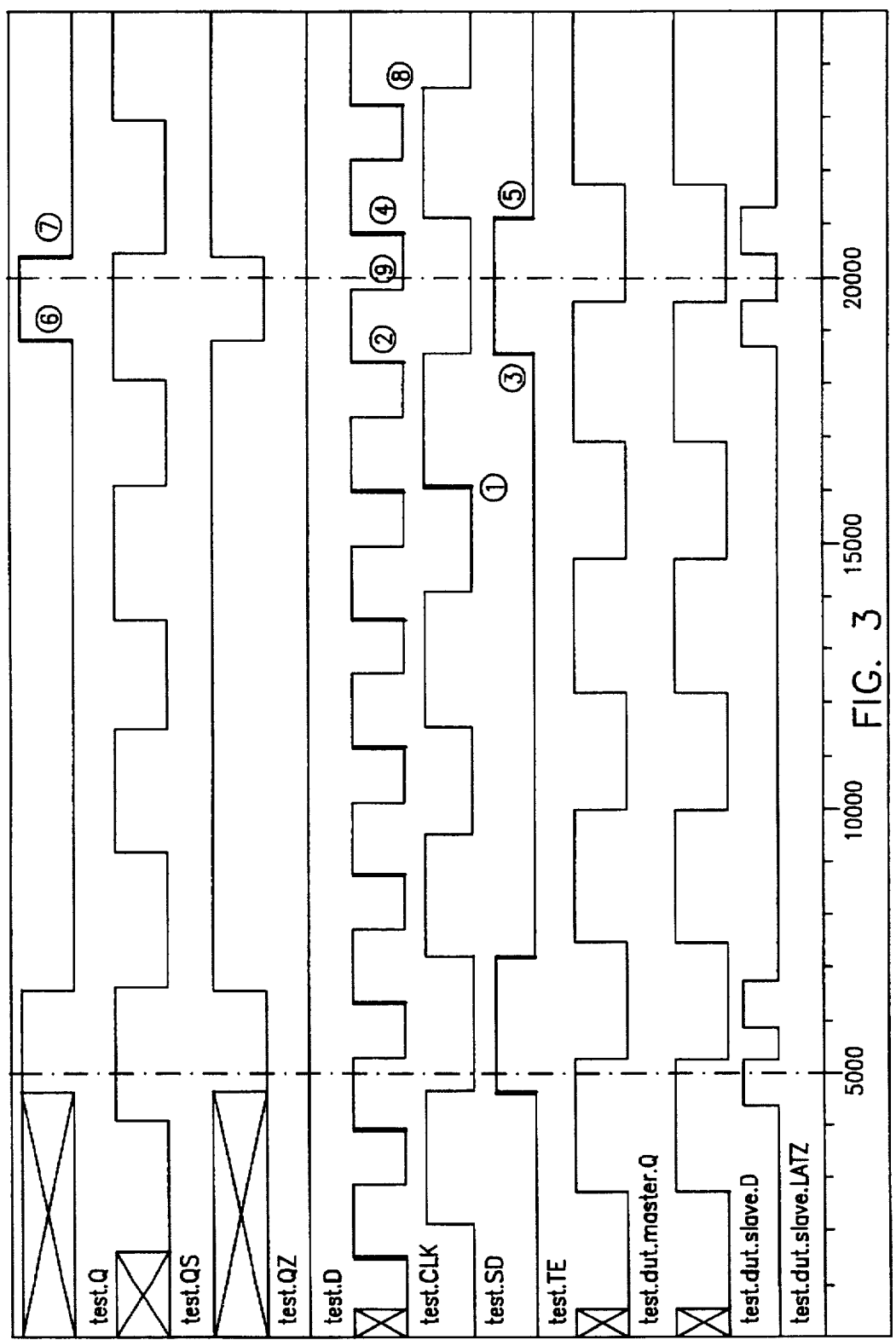
FIG. 3 is a timing diagram illustrating operation of the FIG. 2 scan flip-flop in test mode.

A discussion of the operation of the scan flip-flop 200 will now be provided. Referring to FIG. 3, in the discussion, the first clock before TEZ goes high will be referred to as the launch clock. This is the clock that will update the Q output of the device 200 with the value on the SD input pin. The clock when TEZ is low will be referred to as the capture clock. This is the clock that captures the logic value present on the D input of device 200 during this time, so that it may shifted out during the next shift cycle. When a latch is referred to as open, it is in transparent mode; when a latch is referred to a closed, it is in hold mode.

As stated above, for normal operation TEZ is held at logic one (inactive). This configures the device 200 as a positive edge triggered flip-flop. When the device 200 is used for applying ATPG vectors, there is a constraint placed on clocking. Return to one clocking must be used. Return to one clocking is an active low clock. Since the flop is edge sensitive, this only means that the clock will remain high during data transitions. The rising edge of the clock will remain in the same place as if return to zero clocking was used. The clock in FIG. 3 is return to one clocking. This allows the slave latch 206 to be updated from the master latch 204 in a hazard-free manner during the capture cycle. The return to one constraint does not limit ATPG in any way, and only applies for test mode operation. The return to one clocking eliminates the need to design in a way to update the slave latch 206 with the value shifted into the master latch 204 during the launch cycle. On previous devices of this type, such as the device disclosed in the above-cited Giles et al patent, this was done with a dedicated latch, which increased area.

Referring to FIG. 3, the following example illustrates the problem return to one clocking solves. With return to zero clocking, the clock is low at edge (3) where TEZ goes high. This allows the logic value on the D input to flow into the master latch 204. The problem is that the slave latch 206 would not get updated until edge (4), when the master latch 204 contains the logic value that was on the D input when TEZ went high. Therefore, the slave latch 206 gets updated with D rather than SD.

The desired operation is for the slave latch 206 to get updated from the master latch 204 before the master latch 204 gets updated with the value on the D input. This is accomplished by return to one clocking. AS shown in FIG. 3, with return to one clocking, the clock would be high at edge (3) where TEZ goes high. This means the master latch 204 is still holding the value shifted in from the SD input. When TEZ goes high, the clock is also high, and the logic value in the master latch 204 flows into the slave latch 206, and appears at the QZ output. When the clock goes low at (9), the slave latch 206 closes and the master latch 204 opens. Now the master latch 204 contains the value present on the D input at (3), and the slave latch 206 contains the value present on the SD input at (2). This is the desired operation.

With regard to the timing during muxscan ATPG, the launch clock occurs at (2), where during the clock low period before (2), the logic one at the SD input flows into the master latch 204. During the clock high time after (2), the master latch 204 closes, holding the logic one. When TEZ goes high at (3), the slave latch 206 opens, as TEZ is high and the clock is low. The logic one held in the master latch 204 is passed to the slave latch 206, overwriting the logic zero held from the last capture clock. This updates the Q output of device 200 with the logic value that was present on the SD input during the launch clock, which is the desired operation for the muxscan protocol.

The Q output change is shown at (6). Note that the update occurs when TEZ goes high, rather than immediately following the launch clock. This still complies with the muxscan protocol. It just shortens the time allowed for the launched value at Q to propagate to the D input of another device. The clock period can be adjusted to compensate.

The capture clock occurs when the clock goes high at (4). During the clock low time before (4), the logic zero present at the D input flows into the master latch 204. At (4), the master latch 204 holds the logic zero. During the clock high time after (4), the logic zero flows into both the slave latch 206 and the dynamic scan latch 208. At (5), the slave latch 206 is disabled by TEZ going low, holding the logic zero until edge (3) of next capture cycle. The logic zero is clocked out from the dynamic scan latch 208 and into the SD input of the next device in the scan chain at (8).

Figure 4:
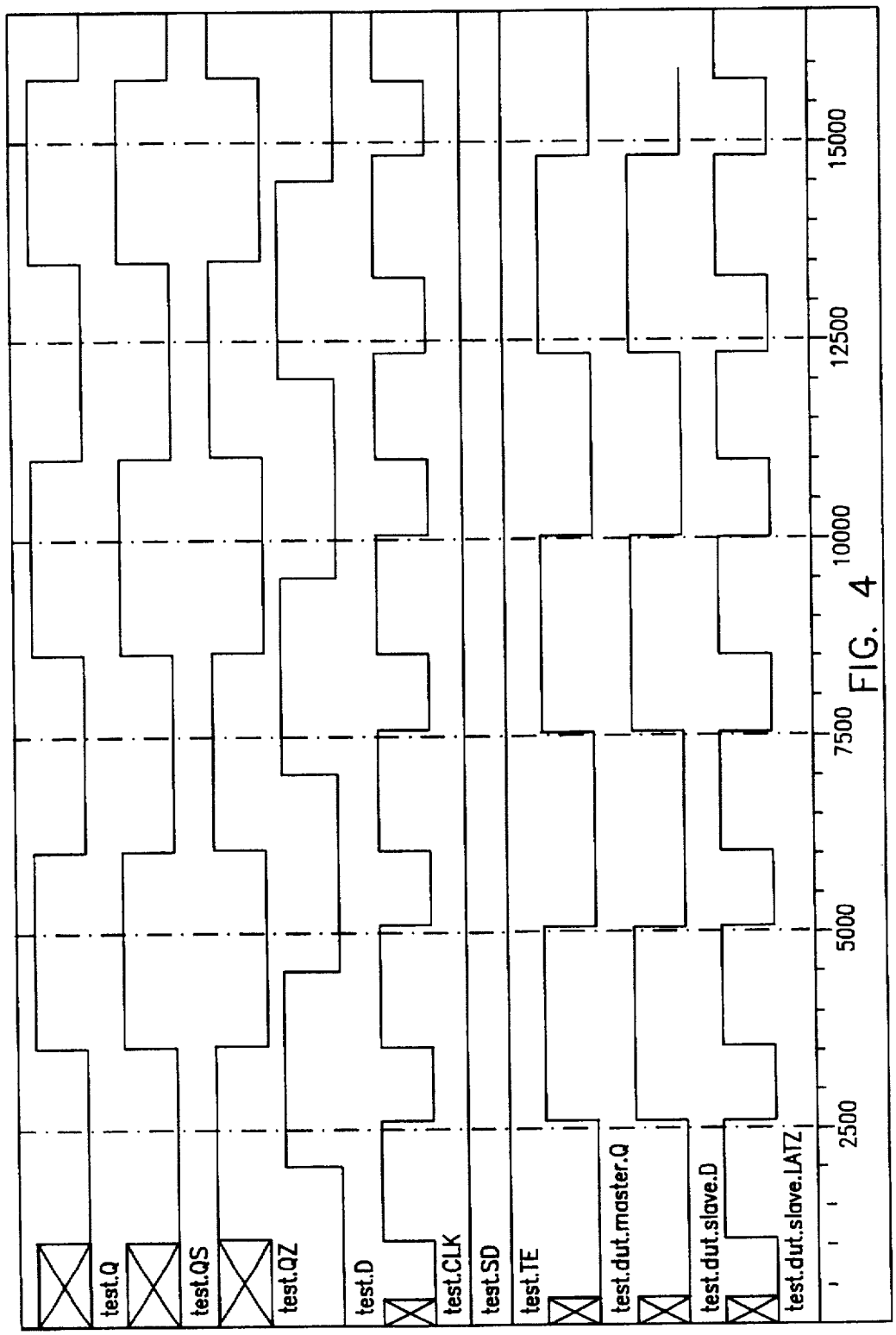
FIG. 4 is a timing diagram illustrating operation of the FIG. 2 scan flip-flop in normal mode.

Timing for normal operation of the FIG. 2 circuit 200 is shown in FIG. 4.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A scan flip-flop circuit that holds state during scan shifting, the scan flip-flop circuit comprising:
  a multiplexer stage that responds to a logic state of a test enable control signal by providing a normal data input signal received at a normal data input node as the multiplexer stage output when the test enable control signal is in an inactive logic state and by providing a scan data input signal received at a scan input node as the multiplexer stage output when the test enable control signal is in an active logic state;

a master latch stage connected to receive and store the multiplexer stage output on periodic transitions of a clock signal provided to the master latch stage;

a slave latch stage that includes a slave latch gating element connected to the master latch stage and responsive to the test enable control signal such that a data value stored in the master latch stage is provided from a master latch output node to the slave latch stage on periodic transitions of the clock signal when the test enable control signal is in the inactive logic state and is blocked from the slave latch stage when the test enable control signal is in the active logic state; and a dynamic scan latch element that passes data value stored in the master latch stage to a scan data output of the scan flip-flop circuit on periodic transitions of the clock signal when the test enable control signal is in the active logic state.

2. A scan flip-flop circuit as in claim 1 wherein the multiplexer stage comprises: a multiplexer inverter element that receives the test enable control signal and provides the complement of the test enable control signal at its output;

a first multiplexer pass gate that includes a first n-channel multiplexer transistor having its gate connected to receive the test enable control signal and its source/drain regions connected between the normal data input node and the multiplexer stage output, and a first p-channel multiplexer transistor having its gate connected to receive the complement of the test enable control signal and its source/drain regions connected between the normal data input node and the multiplexer stage output; and a second multiplexer pass gate that includes a second n-channel multiplexer transistor having its gate connected to receive the complement of the test enable control signal and its source/drain regions connected between the scan data input node and the multiplexer stage output, and a second p-channel multiplexer transistor having its gate connected to receive the test enable control signal and its source/drain regions connected between the scan data input node and the multiplexer stage output.

3. A scan flip-flop circuit that holds state during scan shifting, the scan flip-flop circuit comprising:

(a) a multiplexer stage that responds to a logic state of a test enable control signal by providing a normal data input signal received at a normal data input node as the multiplexer stage output when the test enable control signal is in an inactive logic state and by providing a scan data input signal received at a scan input node as the multiplexer stage output when the test enable control signal is in an active logic state;

(b) a master latch stage connected to receive and store the multiplexer stage output on periodic transitions of a clock signal provided to the master latch stage;

(c) a slave latch stage that includes a slave latch gating element connected to the master latch stage and responsive to the test enable control signal such that a data value stored in the master latch stage is provided from a master latch output node to the slave latch stage on periodic transitions of the clock signal when the test enable control signal is in the inactive logic state and is blocked from the slave latch stage when the test enable control signal is in the active logic state; and (d) a dynamic scan latch element that passes data value stored in the master latch stage to a scan data output of the scan flip-flop circuit on periodic transitions of the clock signal when the test enable control signal is in the active logic state, the dynamic scan latch element including:

(i) a scan latch inverter having its output connected to the scan data output of the scan flip-flop circuit; and (ii) a scan latch pass gate that includes a n-channel scan latch transistor having its gate connected to receive the clock signal and its source/drain regions connected between the output of the master latch output node and the input of the scan latch inverter, and a p-channel scan latch transistor having its gate connected to receive the complement of the clock signal and its source/drain regions connected between the output of the master latch output node and the input of the scan latch inverter.

4. A scan flip-flop circuit that holds state during scan shifting, the scan flip-flop circuit comprising:

(a) a multiplexer stage that responds to a logic state of a test enable control signal by providing a normal data input signal received at a normal data input node as the multiplexer stage output when the test enable control signal is in an inactive logic state and by providing a scan data input signal received at a scan input node as the multiplexer stage output when the test enable control signal is in an active logic state, the multiplexer stage including:

(i) a multiplexer inverter element that receives the test enable control signal and provides the complement of the test enable control signal at its output;

(ii) a first multiplexer pass gate that includes a first n-channel multiplexer transistor having its gate connected to receive the test enable control signal and its source/drain regions connected between the normal data input node and the multiplexer stage output, and a first p-channel multiplexer transistor having its gate connected to receive the complement of the test enable control signal and its source/drain regions connected between the normal data input node and the multiplexer stage output; and (iii) a second multiplexer pass gate that includes a second n-channel multiplexer transistor having its gate connected to receive the complement of the test enable control signal and its source/drain regions connected between the scan data input node and the multiplexer stage output, and a second p-channel multiplexer transistor having its gate connected to receive the test enable control signal and its source/drain regions connected between the scan data input node and the multiplexer stage output;

(b) a master latch stage connected to receive and store the multiplexer stage output on periodic transitions of a clock signal provided to the master latch stage; the master latch stage comprises:

(i) a first master latch inverter connected to receive the clock signal and to provide the complement of the clock signal at its output;

(ii) first and second master pass gate nodes;

(iii) a first master latch pass gate that includes a first n-channel master latch transistor having its gate connected to receive the complement of the clock signal and its source/drain regions connected between the multiplexer stage output and the first master pass gate node, and a first p-channel master latch transistor having its gate connected to receive the clock signal and its source/drain regions connected between the multiplexer stage output and the first master pass gate node;

(iv) a second master latch pass gate that includes a second n-channel master latch transistor having its gate connected to receive the clock signal and its source/drain regions connected between the first and second master pass gate nodes, and a second p-channel master latch transistor having its gate connected to receive the complement of the clock signal and its source/drain regions connected between the first and second master pass gate nodes;

(v) a second master latch inverter having its input connected to the first master pass gate node and its output connected to the master latch stage output node; and (vi) a third master latch inverter having its input connected to the master latch stage output node and its output connected to the second master pass gate node.

(c) a slave latch stage that includes a slave latch gating element connected to the master latch stage and responsive to the test enable control signal such that a data value stored in the master latch stage is provided from a master latch output node to the slave latch stage on periodic transitions of the clock signal when the test enable control signal is in the inactive logic state and is blocked from the slave latch stage when the test enable control signal is in the active logic state; and (d) a dynamic scan latch element that passes data value stored in the master latch stage to a scan data output of the scan flip-flop circuit on periodic transitions of the clock signal when the test enable control signal is in the active logic state.

5. A scan flip-flop circuit as in claim 4 and wherein the slave latch gating element comprises a gating element pass gate that includes a n-channel gating transistor having its gate connected to receive the test enable control signal and its source/drain regions connected between the master latch stage output node and a slave latch input node, and a p-channel gating transistor having its gate connected to receive the complement of the test enable control signal and its source/drain regions connected between the master latch output node stage and the slave latch input node.

6. A scan flip-flop circuit as in claim 5 and wherein the slave latch stage further comprises: first and second slave pass gate nodes;

a data output node;

a first slave latch pass gate that includes a first n-channel slave latch transistor having its gate connected to receive the clock signal and its source/drain regions connected between the slave stage input node and the first slave pass gate node, and a first p-channel slave latch transistor having its gate connected to receive the complement of the clock signal and its source/drain regions connected between the slave stage input node and the first slave pass gate node;

a second slave latch pass gate that includes a second n-channel slave latch transistor having its gate connected to receive the complement of the clock signal and its source/drain regions connected between the first and second slave pass gate nodes, and a second p-channel slave latch transistor having its gate connected to receive the clock signal and its source/drain regions connected between the first and second slave pass gate nodes;

a first slave latch inverter having its input connected to the first slave pass gate node and its output connected to the data output node to provide a normal data output signal; and a second slave latch inverter having its input connected to the data output node and its output connected to the second slave pass gate node such that the output of the second slave latch provides the complement of the normal data output signal.

* * * * *

UNITED STATES PATENT AND TRADEMARK OFFICE
CERTIFICATE OF CORRECTION

PATENT NO. : 5,633,606
DATED : May 27, 1997
INVENTOR(S) : Brian Christopher Gaudet et al.

It is certified that error appears in the above-indentified patent and that said Letters Patent is hereby corrected as shown below:

In Col. 8, line 3, after "latch" insert --stage--.

In Col. 8, line 4, after "output node" delete "stage".

Signed and Sealed this

Twenty-second Day of July, 1997

Attest:

Attesting Officer

BRUCE LEHMAN

Commissioner of Patents and Trademarks